United States Patent
Tokita et al.

(10) Patent No.: US 7,690,912 B2
(45) Date of Patent: Apr. 6, 2010

(54) PATTERN TRANSFERRING MOLD, PATTERN TRANSFERRING APPARATUS AND DEVICE MANUFACTURING METHOD USING THE SAME

(75) Inventors: Toshinobu Tokita, Yokohama (JP); Hirohisa Ota, Kawagoe (JP); Eigo Kawakami, Utsunomiya (JP); Kazuyuki Kasumi, Utsunomiya (JP); Takashi Nakamura, Edogawa-ku (JP)

(73) Assignee: Canon Kabushiki Kaisha (JP)

( * ) Notice: Subject to any disclaimer, the term of this patent is extended or adjusted under 35 U.S.C. 154(b) by 1059 days.

(21) Appl. No.: 11/364,631

(22) Filed: Feb. 27, 2006

(65) Prior Publication Data

US 2006/0192320 A1    Aug. 31, 2006

(30) Foreign Application Priority Data

Feb. 28, 2005   (JP)   ............................ 2005-055097

(51) Int. Cl.
*B29C 33/44* (2006.01)
*B29C 35/08* (2006.01)

(52) U.S. Cl. ............................ 425/436 R; 425/174.4; 425/385; 425/437; 264/447; 264/494; 264/496

(58) Field of Classification Search ................ 425/385, 425/437, 174.4, 436 R; 264/447, 494, 496
See application file for complete search history.

(56) References Cited

U.S. PATENT DOCUMENTS

| 6,334,960 | B1 | 1/2002 | Willson et al. |
| 2004/0190433 | A1* | 9/2004 | Hisada et al. ............ 369/275.1 |
| 2004/0192041 | A1* | 9/2004 | Jeong et al. ................. 438/689 |

FOREIGN PATENT DOCUMENTS

| JP | 11-333862 | 12/1999 |
| JP | 2002-539604 | 11/2002 |
| JP | 2003-222706 | 8/2003 |
| JP | 2003-222708 | 8/2003 |

* cited by examiner

*Primary Examiner*—Kat Wyrozebski
*Assistant Examiner*—Robert J Grun
(74) *Attorney, Agent, or Firm*—Rossi, Kimms & McDowell LLP (57) ABSTRACT

One object of the present invention is to provide a pattern transferring mold which can provide a starting area of mold release easily and certainly and a pattern transferring apparatus with the same. A pattern transferring mold is disclosed which is used in a pattern transferring apparatus that brings the mold into contact with a photo-curing resin on a substrate and cures the photo-curing resin by light irradiation to transfer a pattern formed on the mold onto the photo-curing resin. The mold comprises a bottom face which contacts the photo-curing resin, the bottom face portion including a first area in which the pattern is formed and a second area formed outside the first area. The mold has a mold-releasing shape in the second area, the mold-releasing shape providing a starting area of mold release from the cured photo-curing resin.

15 Claims, 9 Drawing Sheets

PRIOR ART

FIG. 10A

PRIOR ART

FIG. 10B

PATTERN TRANSFERRING MOLD, PATTERN TRANSFERRING APPARATUS AND DEVICE MANUFACTURING METHOD USING THE SAME

BACKGROUND OF THE INVENTION

The present invention relates to a pattern transferring apparatus for manufacturing semiconductor devices or devices having a fine pattern such as MEMS (Micro Electro-Mechanical Systems) and, more specifically, to so-called photo-curing type nanoimprint lithography.

In a photo-curing type nanoimprint apparatus used for nanoimprint lithography, which has been disclosed in U.S. Pat. No. 6,334,960, a liquid ultraviolet (UV) curable resin as a resist is disposed between a substrate and a mold (original plate or template) having a relief pattern, and then the resist is cured by UV irradiation through the mold. The mold is released from the substrate after curing the resist, and the pattern-transferred resist thereby remains on the substrate.

Then, residual layer (base layer) of the resist are removed by executing RIE (reactive ion etching) on the pattern-transferred substrate. Thereby, a pattern is formed on the substrate.

Manufacturing of semiconductor devices is generally repeated at a high speed by Step-and-Repeat method or the like. Therefore, a long time to release the mold from the substrate (hereinafter, it is referred to as mold release) decreases throughput of the nanoimprint apparatus, furthermore productivity of the device.

Figure 10A:
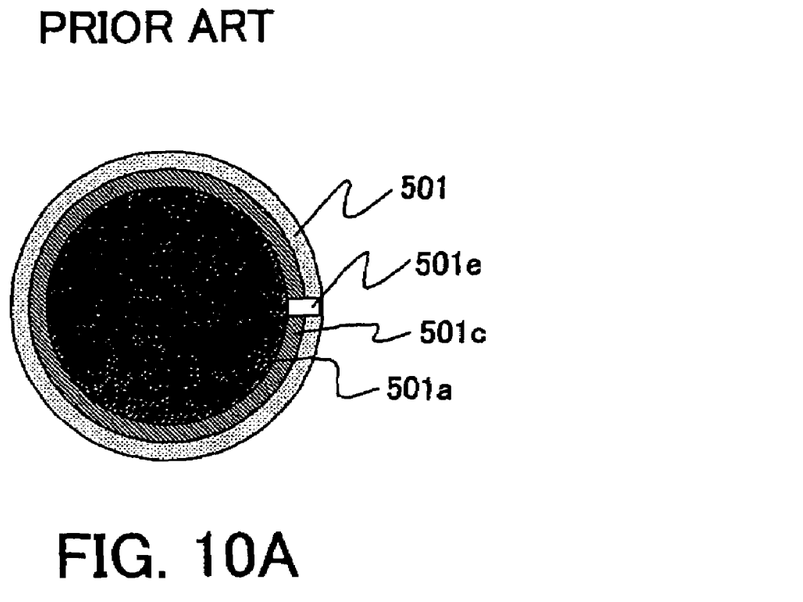
FIGS. 10A and 10B are figures showing conventional mold-releasing methods.

In the field of injection molding, the following method to shorten an amount of time for mold release is known. FIG. 10A shows a mold-releasing method disclosed in Japanese Patent Laid-Open Application No. H11-333862.

FIG. 10A shows a die for forming an optical element that is an object of molding. 501*a* denotes a first die face for forming an effective diameter portion of the optical element, and 501*c* denotes a second die face for forming the peripheral edge of the optical element. 501 denotes an outer portion of the die.

In the second die face 501*c* and the peripheral portion 501, a through hole 501*e* is provided for taking outer air into the die. Introducing outer air into the border area between the resin (optical element) and the die through the through hole 501*e*, area which has been a vacuum state, decreases die-releasing force needed to release the die from the optical element. Furthermore, since the opening of the through hole 501*e* provides a starting point of die release, the die release can start smoothly, thereby making it possible to shorten the die-releasing time.

Figure 10B:
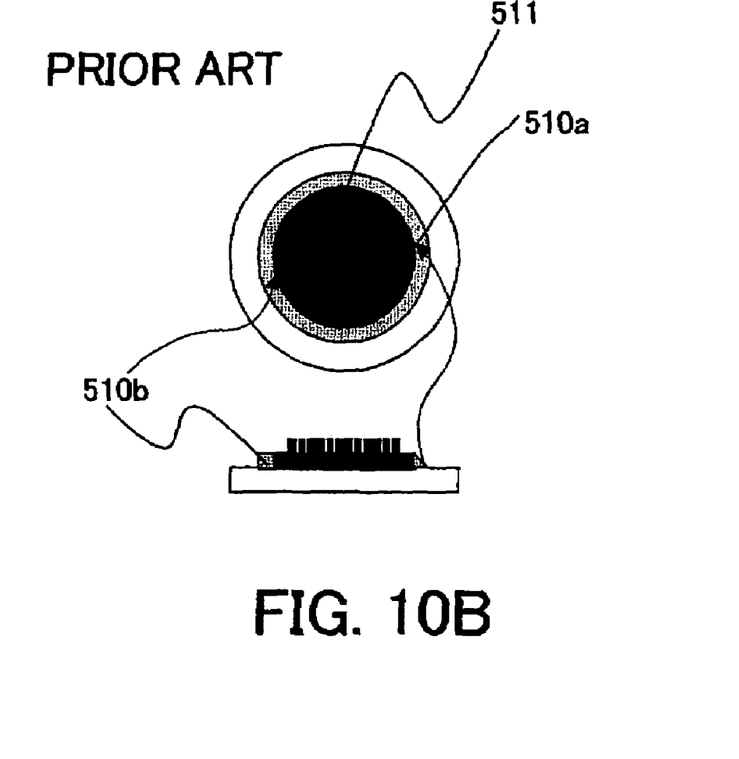

FIG. 10B shows a die-releasing method disclosed in Japanese Patent Laid-Open Applications No. 2003-222706 and 2003-222708. 511 denotes a die face for resin molding, and 510*a* and 510*b* denote protruded portions formed on the molded resin, which formed by depressed portions provided on the die. When viewed from the side of the die, the protruded portion 510*a* has an inclination and the protruded portion 510*b* has a rectangular shape. Stress for die release concentrates on the protruded portions 510*a* and 510*b*, and they therefore provide starting points of die release. This can decrease die-releasing force and shorten die-releasing time.

As described above, it is important to provide the starting point of mold release for facilitating the mold release. However, the die-releasing methods disclosed in Japanese Patent Laid-Open Applications No. H11-333862, 2003-222706 and 2003-222708 relate to resin molding of optical elements such as a lens, and they provide a starting point of mold release on the side of the lens, which does not exist on the lens surface but inevitably exists in the lens.

In contrast, the nanoimprint lithography brings the mold in contact with a planar object surface and transfers a pattern to areas adjacent to each other one after another. Therefore, the die-releasing methods disclosed in Japanese Patent Laid-Open Applications No. H11-333862, 2003-222706 and 2003-222708 cannot be applied to the nanoimprint lithography as they are.

BRIEF SUMMARY OF THE INVENTION

One object of the present invention is to provide a pattern transferring mold which can provide a starting area of mold release easily and certainly and a pattern transferring apparatus with the same.

According to an aspect, the present invention provides a pattern transferring mold which is used for a pattern transferring apparatus that brings the mold into contact with a photo-curing resin on a substrate and cures the photo-curing resin by light irradiation to transfer a pattern formed on the mold onto the photo-curing resin. The pattern transferring mold comprises a bottom face which contacts the photo-curing resin, the bottom face portion including a first area in which the pattern is formed and a second area formed outside the first area. The pattern-transferring mold has a mold-releasing shape in the second area, the mold-releasing shape providing a starting area of mold release from the cured photo-curing resin.

According to another aspect, the present invention provides a pattern transferring apparatus which comprises the above-described pattern transferring mold, and an optical system which irradiates a photo-curing resin contacting the pattern transferring mold with light.

According to another aspect, the present invention provides a pattern transferring apparatus which brings a pattern transferring mold into contact with a photo-curing resin on a substrate and cures the photo-curing resin by light irradiation to transfer a pattern formed on the mold onto the photo-curing resin, the pattern transferring mold having a bottom face which contacts the photo-curing resin, the bottom face portion including a first area in which the pattern is formed and a second area formed outside the first area. The pattern transferring apparatus comprises a material supplying unit which supplies material for providing a starting area of mold release from the cured photo-curing resin between the second area and the uncured photo-curing resin.

According to yet another aspect, the present invention provides a device manufacturing method which comprises the steps of: preparing the above-described pattern transferring apparatus; and transferring the pattern onto the photo-curing resin using the pattern transferring apparatus.

Other objects and features of the present invention will become readily apparent from the following description of the preferred embodiments with reference to accompanying drawings.

DETAILED DESCRIPTION OF THE PREFERRED EMBODIMENTS

Preferred embodiments of the present invention will hereinafter be described with reference to the drawings.

Embodiment 1

Figure 1:
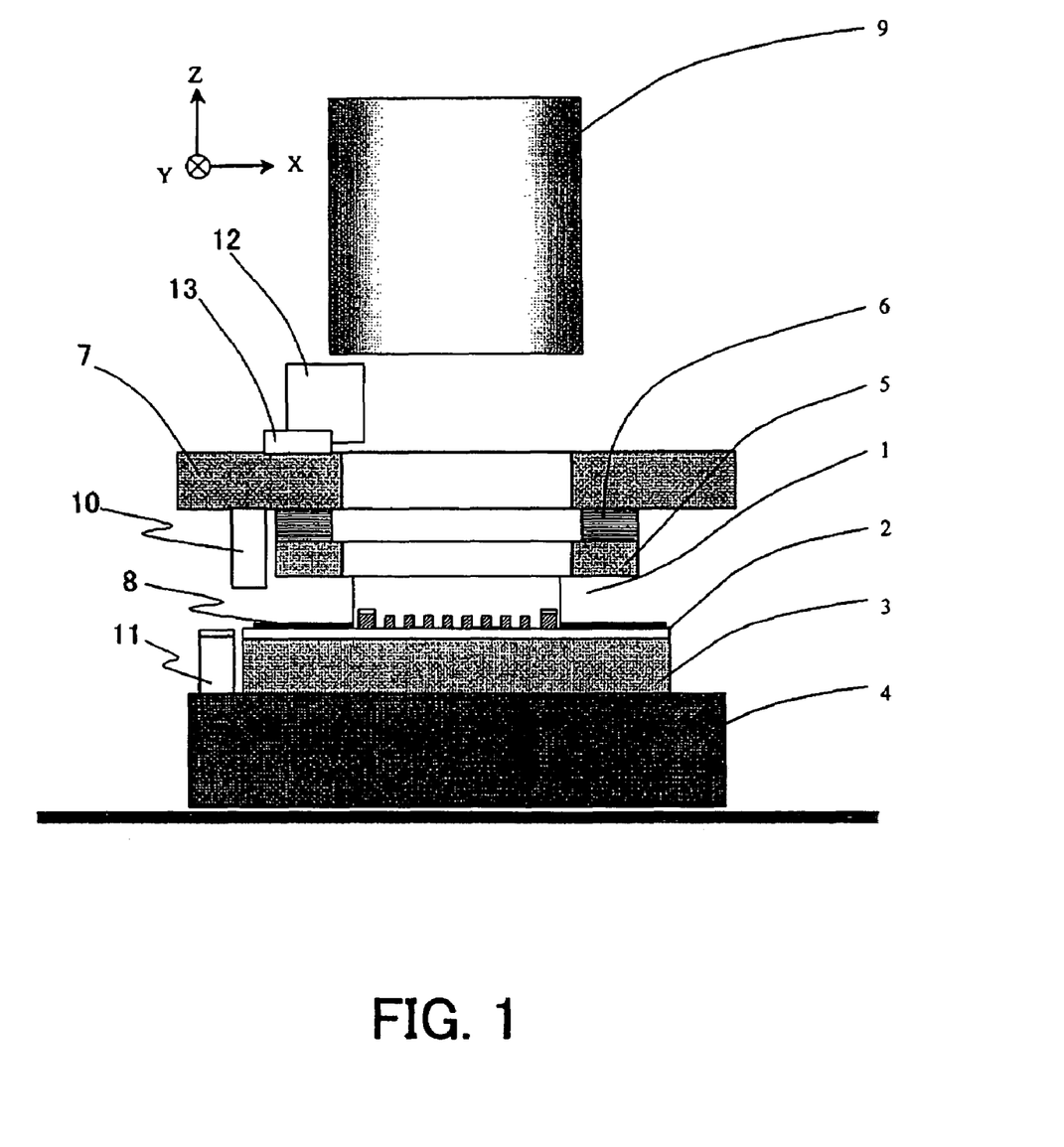
FIG. 1 is a schematic view showing the entire configuration of a nanoimprint apparatus that is Embodiment 1 of the present invention.

FIG. 1 shows a photo-curing type (or UV-curing type) nanoimprint apparatus (or pattern transferring apparatus) in schematic form, which uses a pattern transferring mold that is Embodiment 1.

In FIG. 1, 1 denotes a pattern transferring mold (original plate or a template) having a relief pattern for semiconductor devices such as a large-scale integrated circuit and MEMS. 2 denotes a wafer that is a substrate, and 3 denotes a wafer chuck for holding the wafer 2. 4 denotes a wafer stage for positioning the wafer 2. The wafer stage 4 can perform X, Y and Z axes directional driving and rotational driving ($\omega x$, $\omega y$, and $\theta$) around each axis.

5 denotes a mold chuck for holding the mold 1, and 6 denotes a mold stage for positioning the mold 1. The mold stage 1 needs to rotate around at least Z-axis. It is preferable for the mold stage to perform Z-axis driving and $\omega x$ and $\omega y$ rotations. The mold stage 6 has a mechanism to adjust the degree of parallelization between the mold 1 and the wafer 2 when the mold contacts a resist on the wafer 2.

7 denotes a mold base for holding the mold stage 6. 8 denotes a resist which is a UV-curing resin that is one of photo(light)-curing resins. The resist 8 is supplied onto the wafer 2 and becomes an object on which the pattern of the mold 1 is transferred. The present invention can be applied to not only the case where the UV-curing resin is used but also cases where various photo-curing resins are used.

9 denotes an optical system which irradiates the resist with UV light to cure the resist 8. 10 denotes an off-axis scope which performs alignment measurements of the wafer 2. 11 denotes a reference mark table which is mounted on the wafer stage 4. 12 denotes an alignment scope which performs alignment measurements through the mold 1.

13 denotes an alignment stage which is mounted on the mold base 7. The alignment scope 12 is mounted on the alignment stage 13. The alignment stage 13 is driven so that the optical axis of the alignment scope 12 may coincide with the position of an alignment mark formed on the mold 1.

Figure 8:
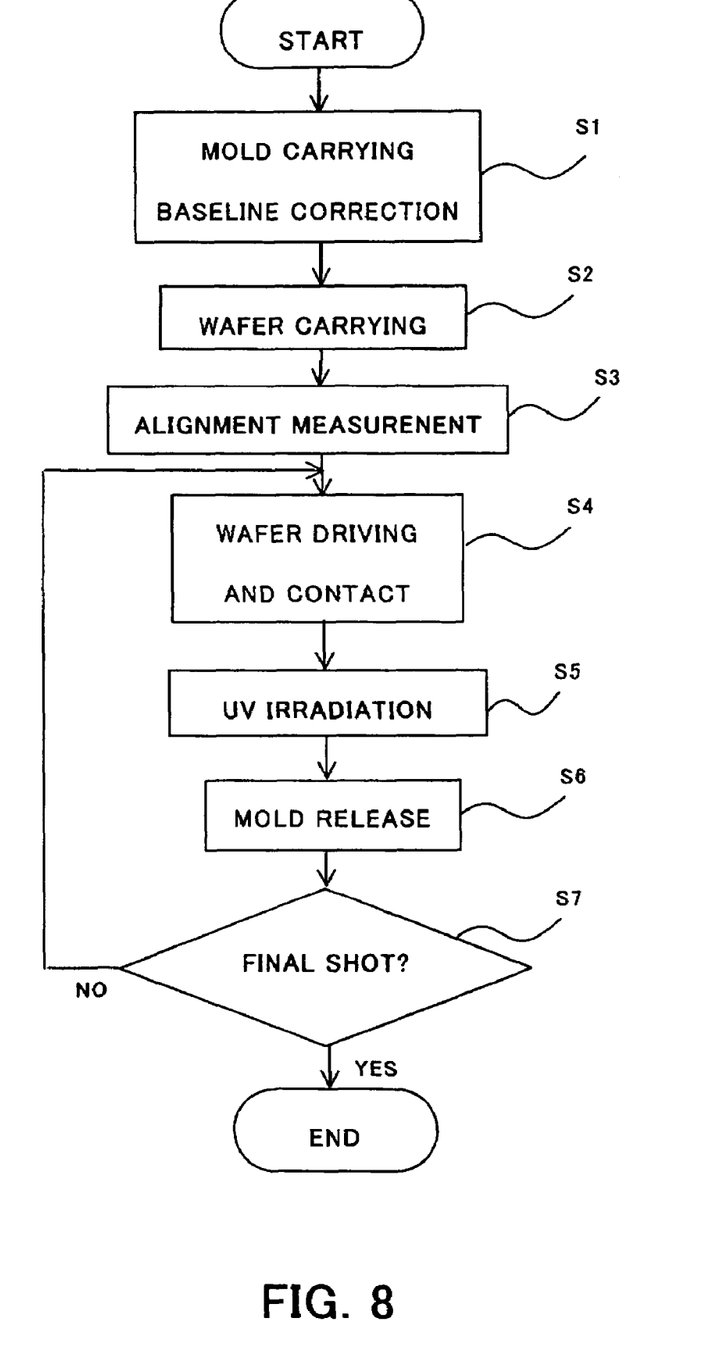
FIG. 8 is a flowchart showing a pattern transferring process by the nanoimprint apparatus of Embodiment 1.

Pattern transferring to the wafer (resist 8) is performed in the above-described nanoimprint lithography apparatus by Step-and-Repeat method shown in FIG. 8. A step is abbreviated as "S" in the figure.

(1) Step for Carrying and Positioning the Mold 1 and for Correcting a Base Line (Step 1)

In this step, the mold 1 is carried and set to the mold stage 6 by an unillustrated mold carrying mechanism. Then, the displacement of the mold 1 is measured by the alignment scope 12, and the mold 1 is positioned to a reference position by driving at least one of the mold stage 6 and the wafer stage 4.

Further, in a case where the off-axis alignment measurement is performed, the base line correction for recognizing the measurement axis of the alignment scope 10 and the position of the mold 1 in advance is performed. Specifically, the reference mark table 11 is measured through the alignment mark on the mold 1 with the alignment scope 10 first, and then the mold stage 4 is driven and the reference mark table 11 is measured with the off-axis scope 10. A base line correction value is calculated from the positional relationship of the wafer stage 4 with respect to the reference mark table 11.

(2) Step for Carrying the Wafer 2 (Step 2)

In this step, the wafer 2 to which the resist 8 is applied is carried by an unillustrated wafer carrying mechanism and held by the wafer chuck 3.

(3) Step for an Alignment Measurement (Step 3)

In this step, the displacement amount of the wafer 2 is measured with the off-axis scope 10, and then the follow-on alignment of the wafer stage 4 is corrected.

(4) Step for Driving the Mold 1 and Bringing the Mold 1 Into Contact With the Resist 8 (Step 4)

In this step, the wafer stage 4 is driven to move the wafer 2 to the position where the first shot position on the wafer 2 faces the mold 1. Further, at least one of the wafer stage 4 and the mold stage 1 is driven to bring the mold 1 into contact with the resist 8 on the wafer 2.

(5) Step for UV Irradiation (Step 5)

In this step, the optical system 9 irradiates the resist 8 with UV light through the mold 1. This is called a shot. The resist 8 contacting the mold 1 is cured by the shot.

(6) Step for Mold Release (Step 6)

In this step, at least one of the wafer stage 4 and the mold stage 1 is driven to release the mold 1 from wafer 2. Providing an after-mentioned starting point of mold release that is a starting area of mold release is important at this point.

(7) Step for Determining the Final Shot (Step 7)

In this step, it is determined whether or not the shot at Step 5 is the final shot. If it is not the final shot, the flow returns to step 4 to drive the wafer stage 4 so that the next shot position on the wafer 2 may face the mold 1, and Steps 5 and 6 are repeated. A scribe line, later described, is formed between the previous shot position where the pattern was transferred and the shot position adjacent thereto.

On the other hand, if it is the final shot, the pattern transferring to the wafer 2 is finished. Then, the wafer carrying mechanism takes out the wafer 2.

Although the description was hereinbefore made of each step based on the assumption that a global alignment was executed in Step 3, a die-by-die alignment in which an alignment measurement and positional correction of each step are performed can be adopted. Further, although the description was hereinbefore made of a method in which the off-axis alignment measurement is performed, an alignment measurement through the mold 1 using the alignment scope 12 can be adopted.

The resist 8 on which the pattern of the mold 1 has been transferred on the collected wafer 2 is etched by RIE (reactive ion etching) to form a pattern on the wafer 2.

Next, the description will be made of a method for performing the mold release smoothly in a short time so as to hold the shape of the transferred pattern, using FIGS. 2A through 2C.

Figure 2A:
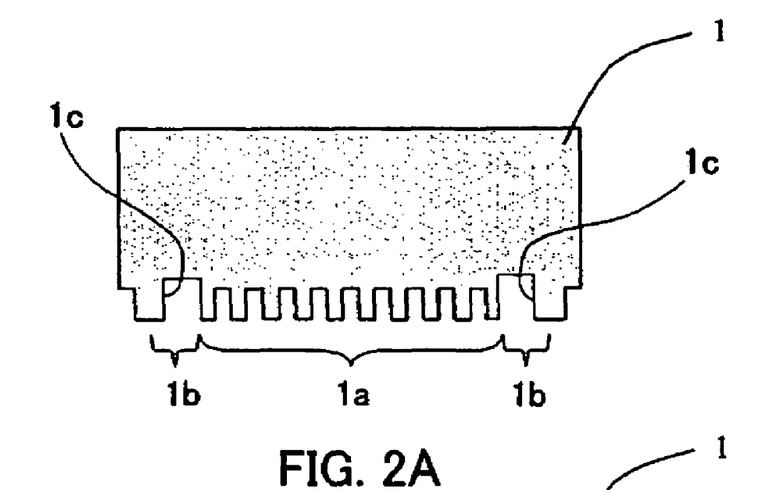
FIGS. 2A, 2B and 2C are schematic views showing a mold used in the apparatus in Embodiment 1.

FIG. 2A shows the mold 1 in schematic form. 1a denotes a patterned area (first area) of the bottom face of the mold 1, the bottom face being a contacting face which contacts the resist 8. The patterned area 1a has the relief pattern which is transferred on the resist 8. The pattern has a relief shape having a width of 50 nm and a depth of 100 nm, for example.

1b denotes a non-patterned area (second area) of the bottom face of the mold 1, the non-patterned area 1b being formed in the outer circumferential area (outside) of the pattern area 1a in the bottom face. A non-patterned depression portion 1c is formed in the non-patterned area 1b. The non-patterned depression portion 1c has a size (width and depth) larger than the depressed portion of the mold pattern (hereinafter, it is referred to as a patterned depression portion).

The non-patterned area 1b is an area corresponding to a so-called scribe line. The scribe line in photolithography apparatus such as a stepper and scanner corresponds to an area on a wafer where an alignment mark is provided, penumbra blurring is absorbed, and exposure is duplicated by adjacent shots.

Furthermore, when a plurality of shots are executed on a single wafer, cutting the wafer in the scribe line can separate each of chips. Although this embodiment relates to nanoimprint lithography, there is a possibility that penumbra blurring occurs in some degree because of UV irradiation. Therefore, a plurality of shots are executed with the scribe line left on the wafer, which is also for performing alignment and keeping a cutting margin.

Figure 3A:
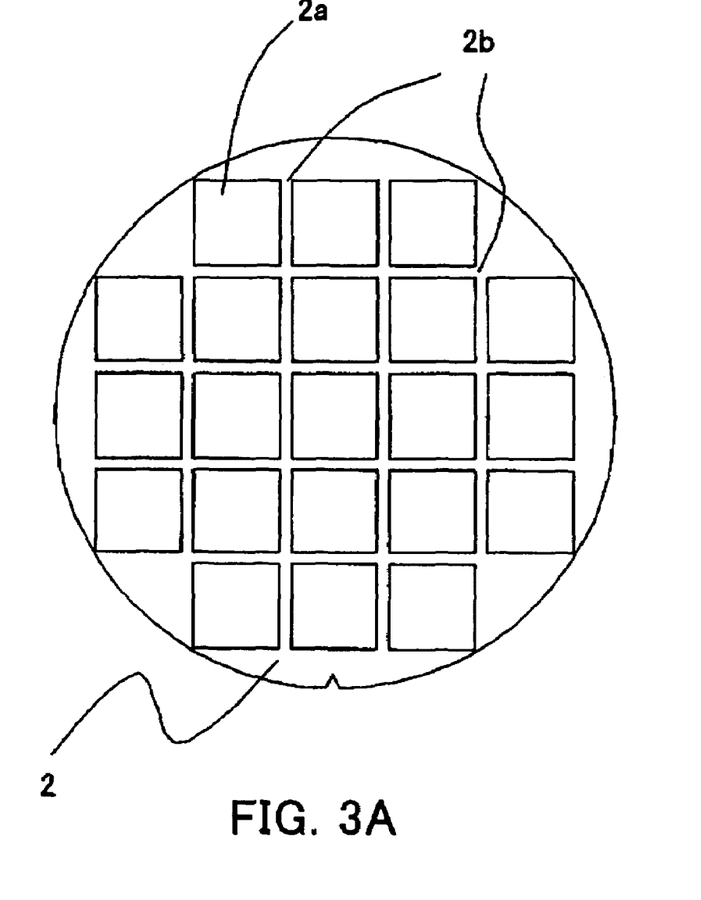
FIGS. 3A and 3B are figures for explaining a scribe line.

FIG. 3A shows an example of the scribe line on the wafer 2 having a twenty-one-shot layout. The square areas in the figure are shot areas 2a, and linear areas between the adjacent shot areas 2a and the peripheral area around the twenty-one shots areas 2a are scribe lines 2b.

Figure 3B:
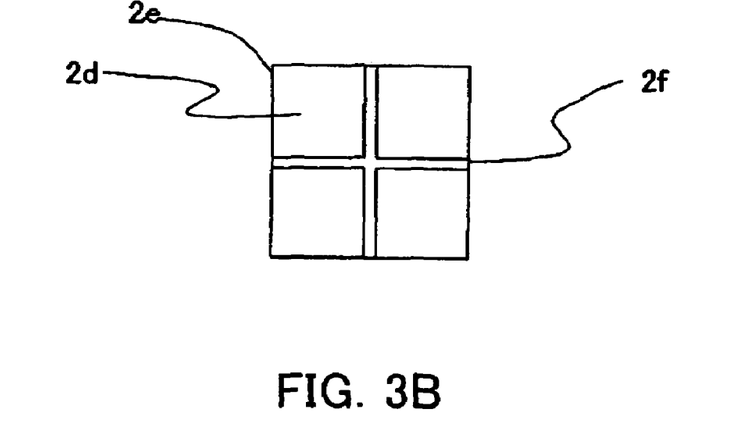

FIG. 3B shows a shot in a case where four patterns are transferred per shot to produce four chips. Linear areas existing between four pattern-transferred areas 2d in one shot area 2e are also the scribe lines.

The shot layout and the number of transferred patterns are optional, and the shape of the shot area and pattern-transferred area are also optional.

The non-patterned area 1b is not needed on the mold 1 essentially to make such a scribe line. However, in this embodiment the non-patterned area 1b is purposefully formed outside the patterned area 1a on the mold 1, the area 1b facing a presumptive area of the scribe line (hereinafter, the presumptive area is referred to simply as a scribe line) on the resist 8, for providing a starting point of mold release on the scribe line, and the non-patterned depression portion 1c is provided therein. This is the same in the other embodiments whose mold-releasing shapes are different from that of this embodiment.

Figure 2B:
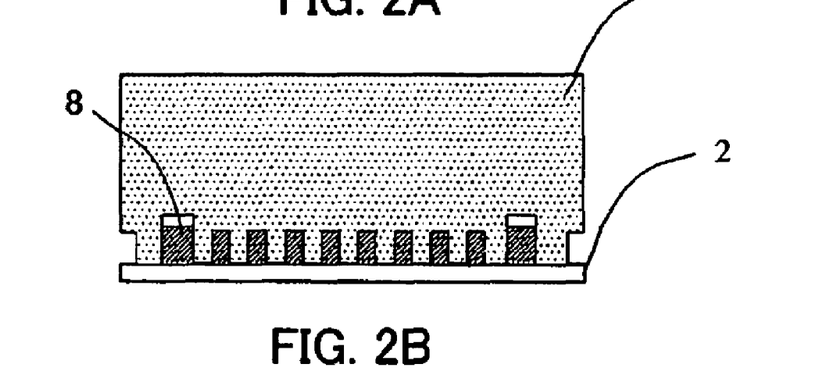
Figure 2C:
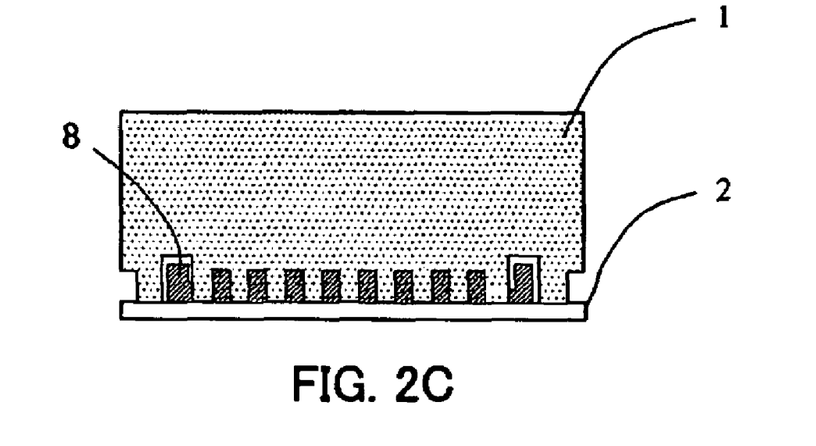

When the mold 1 contacts the resist 8 on the wafer 2 as shown FIG. 2B, the resist 8 flows into the patterned depression portion and the non-patterned depression portion 1c. Since non-patterned depression portion 1c is larger than the patterned depression portion, there is a case where the resist 8 flows into the non-patterned depression portion 1c with a small upper space left therein. In this state, irradiating the resist 8 with UV-light from above the mold 1 cures the resist 8.

The cure of the resist 8 causes its volume shrinkage of about 5% to 10%, depending on the type of resin. The volume shrinkage forms upper and side spaces between the inner surface of the non-patterned depression portion 1c and the resist 8 existing therein as shown in FIG. 2C. On the other hand, although volume shrinkage of the resist 8 existing in the patterned depression portion also occurs, since the volume of this portion is much smaller than that of the resist 8 existing in the non-patterned depression portion 1c, the amount of the volume shrinkage is insignificant, and the resist 8 existing in the non-patterned depression portion 1c maintains a shape approximately faithful to the patterned depression portion.

Providing the non-patterned depression portion 1c in the non-patterned area 1b on the mold 1 makes it possible to form a space between the cured resist 8 and the mold 1 as described above, and using this space portion as the starting point of mold release makes it possible to release the mold 1 from the resist 8. Providing the starting point of mold release can decrease the mold-releasing force and shorten the mold-releasing time, compared to a case where there is no starting point of mold release. Furthermore, although the pattern transferred on the resist 8 has an extremely fine shape, since the starting point of mold release is provided in the non-patterned area, it is possible to release the mold 1 from the pattern formed on the resist 8 smoothly so as not to damage the pattern's shape.

The volume shrinkage of the resist becomes larger when UV-light with a strong intensity is applied thereto for a short time than when UV-light with a weak intensity is applied thereto for a long time, even if their dose amounts are same.

Therefore, a second optical system which is separated from the optical system 9 for pattern transferring and irradiates the non-patterned depression portion 1c with UV-light may be used. Using the second optical system can make the total intensity of UV irradiation on the non-patterned depression portion 1c from both the optical systems or the single intensity of UV irradiation from the second optical system stronger than the intensity of UV irradiation on the pattern, thereby making it possible to cause a local and large volume shrinkage of the resist in the non-patterned depression portion 1c and form a larger space between the inner surface of the non-patterned depression portion 1c and the resist 8.

Embodiment 2

Figure 4A:
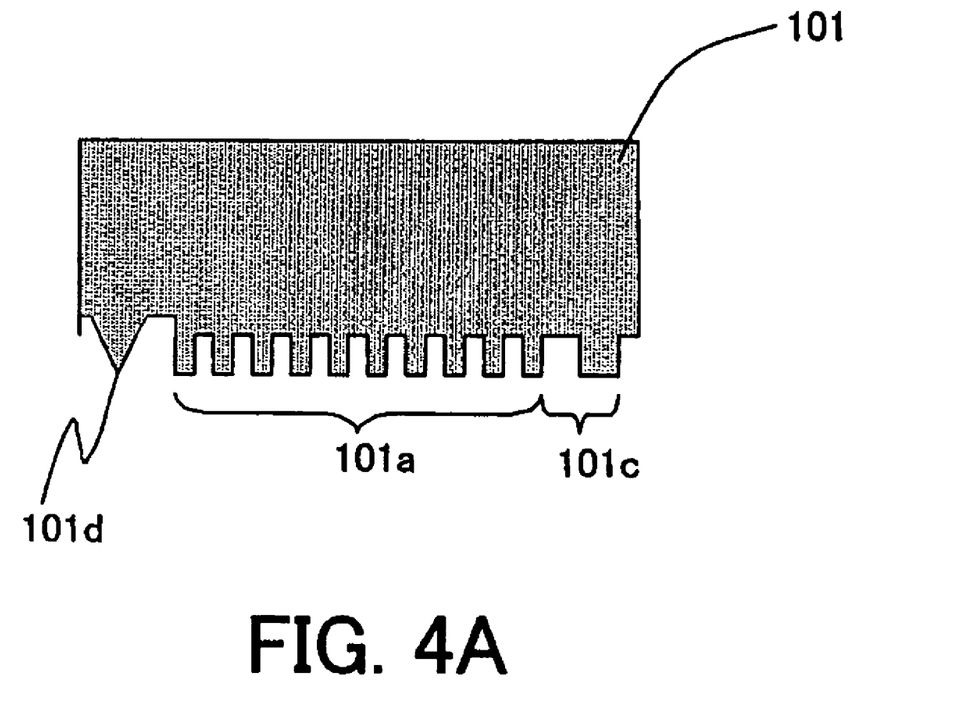
FIGS. 4A and 4B are schematic views showing a mold that is Embodiment 2 of the present invention.

FIG. 4A shows a pattern transferring mold that is Embodiment 2 of the present invention in schematic form. The shape of a pattern formed in a patterned area on the mold of this embodiment is the same as that of Embodiment 1. The mold of this embodiment is used in the nanoimprint apparatus described in Embodiment 1.

101 denotes the mold of this embodiment. 101a denotes a patterned area (first area) where a relief pattern is formed, the patterned area being formed on the bottom face of the mold 101. 101c denotes a non-patterned area (second area) which faces the scribe line on the resist 8.

In FIG. 4A, 101d denotes a protruded portion which is formed in at least a part of the non-patterned area 101c. The protruded portion 101d is a portion having a mold-releasing shape. The protruded portion 101d has a shape such as a conical shape or a triangular prism shape (wedge shape), in which its sectional area becomes smaller towards its lower end. The height of the protruded portion 101d is set to be larger than that of the protruded portion formed in the patterned area 101a.

In a state in which the patterned area 101a and the protruded portion 101d formed in the non-patterned area 101c of this embodiment's mold 101 contact the resist 8, curing the resist 8 by UV irradiation causes the pattern transferring onto the resist 8 and the formation of an inclined surface or a curved surface on the resist 8, the surface having a shape along the outer surface of the protruded portion 101d. The portion of the inclined surface or curved surface in the surface boundary between the mold 101 and the cured resist 8 becomes a starting point of mold release by occurring stress concentration therein at the time of mold release. Therefore, it is possible to decrease the mold-releasing force and shorten the mold-releasing time.

Furthermore, although the pattern transferred on the resist 8 has an extremely fine shape, since the starting point of mold release is provided in the non-patterned area 101*c*, it is possible to release the mold 101 from the pattern formed on the resist 8 smoothly so as not to destroy the pattern's shape.

Figure 4B:
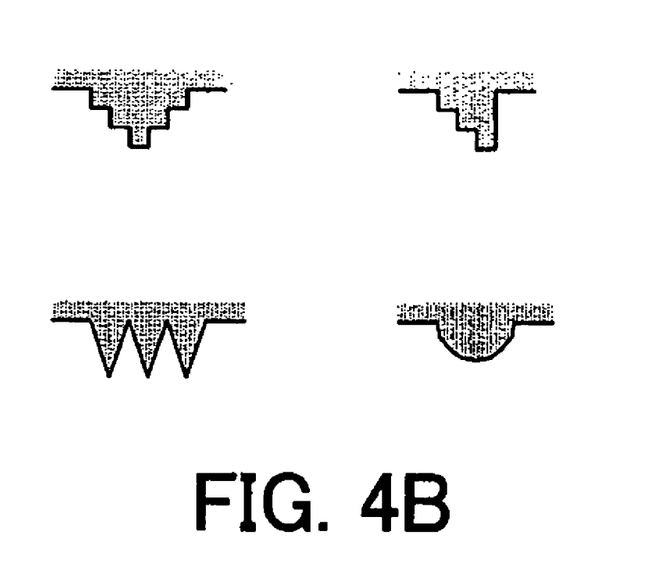

FIG. 4A shows one protruded shape having a conical shape or a wedge shape, the shape of the protruded portion, however, is not limited thereto according to the same thought as in this embodiment. The shape of the protruded portion may be a stepwise shape, a shape including a plurality of conical or wedge shapes, or a semispherical shape, as shown in FIG. 4B, for example. The number of steps in the stepwise shape is optional.

As described above, forming the protruded portion having a shape in which its sectional area becomes smaller towards its lower end makes it possible to provide the stating point of mold release easily. It is preferable that the height of the protruded portion be set to be larger than that of the patterned protruded portion formed in the patterned area 101*a*.

Embodiment 3

Figure 5A:
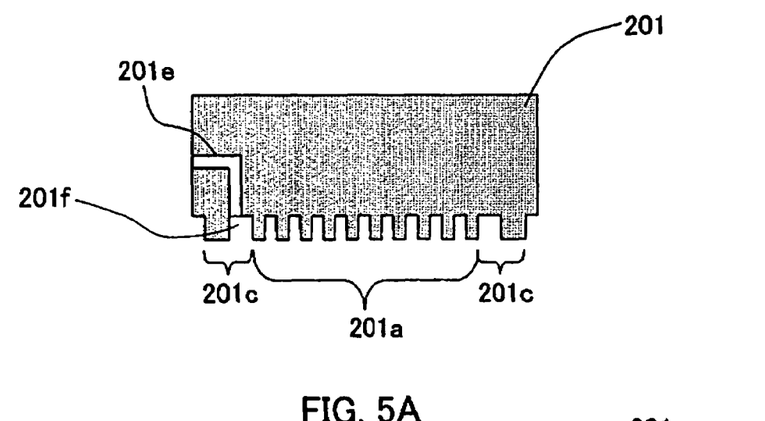
FIGS. 5A and 5B are schematic views showing a mold that is Embodiment 3 of the present invention.

FIG. 5A shows a pattern transferring mold that is Embodiment 3 of the present invention in schematic form. The shape of a pattern formed in a patterned area on the mold of this embodiment is the same as that of Embodiment 1. The mold of this embodiment is also used in the nanoimprint apparatus described in Embodiment 1.

201 denotes the mold of this embodiment. 201*a* denotes a patterned area (first area) where a relief pattern is formed, the patterned area being formed on the bottom face of the mold 201. 201*c* denotes a non-patterned area (second area) which faces the scribe line on the resist 8.

In FIG. 5A, 201*e* denotes a through-hole which penetrates the inside of the mold 201 and opens on the non-patterned area and the side face of the mold 201. The shape of the opening 201*f* of the through-hole 201*e* on the non-patterned area is a mold-releasing shape. The other opening of the through-hole 201*e* may be formed on any face of the mold 201 other than the bottom face.

Outer air can be introduced to the opening 201*f* through the through-hole 201*e* at the time of mold release. Introducing the outer air to the surface boundary between the mold 201 and the resist 8 makes the pressure in this surface boundary equivalent to that of the outer air, thereby making it possible to provide a starting point of mold release in the vicinity of the opening 201*f*.

This configuration can decrease the mold-releasing force and shorten the mold-releasing time, compared to a case where there is no through-hole and the surface boundary between the mold 201 and the resist 8 is in a vacuum state. Furthermore, although the pattern transferred on the resist 8 has an extremely fine shape, since the starting point of mold release is provided in the non-patterned area, it is possible to release the mold 201 from the pattern formed on the resist 8 smoothly so as not to destroy the pattern's shape.

Embodiment 4

Figures 5B, 6:
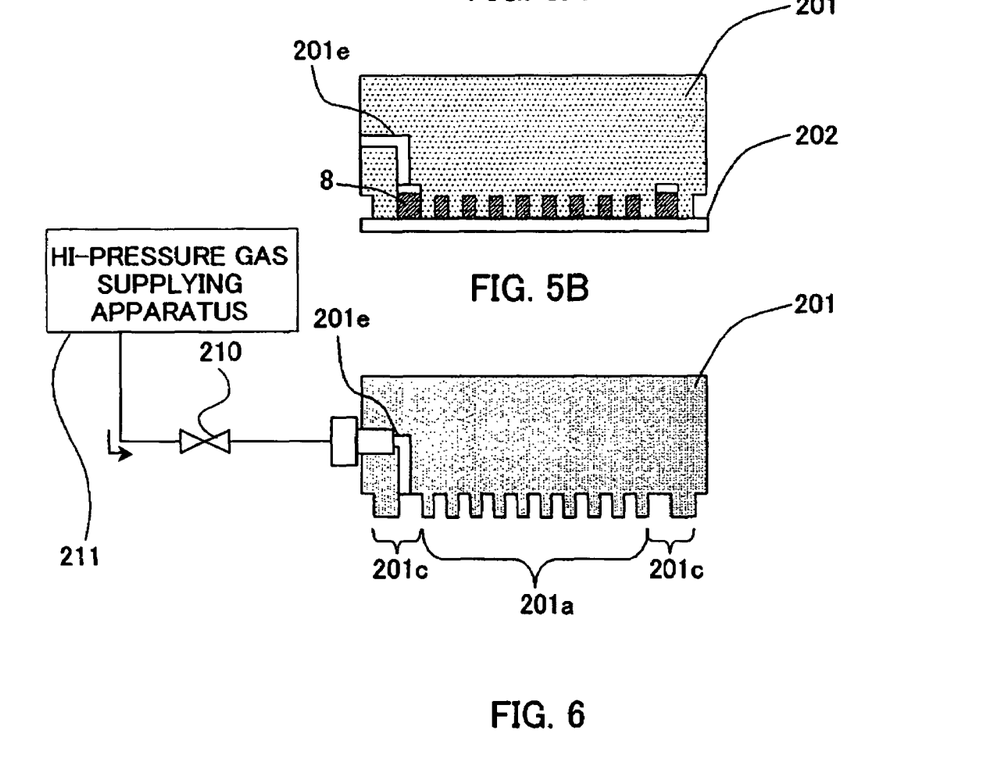
FIG. 6 is a schematic view showing a mold and a nanoimprint apparatus that are Embodiment 4 of the present invention.

FIG. 6 shows the configuration of the periphery of the pattern transferring mold used in a nanoimprint apparatus that is Embodiment 4 of the present invention in schematic form.

The mold in this embodiment is the same as that in Embodiment 3. The basic configuration of the nanoimprint apparatus of this embodiment is the same as that of the nanoimprint apparatus of Embodiment 1.

In this embodiment, a high-pressure gas supplying apparatus 211 is connected to the opening of the through-hole 201*e*, the opening being formed on the side face of the mold 201, via a gas pipe. A valve 210 is provided on the gas pipe, the valve 210 is closed until the resist is cured and opened at the time of mold release. The operation of valve 210 is controlled by a controller, not shown, which governs the whole control of the nanoimprint apparatus's operations.

Opening the valve 210 at the time of mold release supplies the high-pressure gas to the surface boundary between the mold 201 and the resist 8 through the through-hole 201*e*, thereby making it possible to provide a starting point of mold release more effectively than Embodiment 3. This configuration can further decrease the mold-releasing force and further shorten the mold-releasing time, compared to Embodiment 3. Compressed air and nitrogen gas are preferable as the high-pressure gas.

Moreover, in this embodiment, consideration is needed for the connection between the gas pipe and the mold 201 when the mold 201 is carried. An O-ring seal cylinder type pipe joint is preferable for the connection.

Embodiment 5

Figure 7:
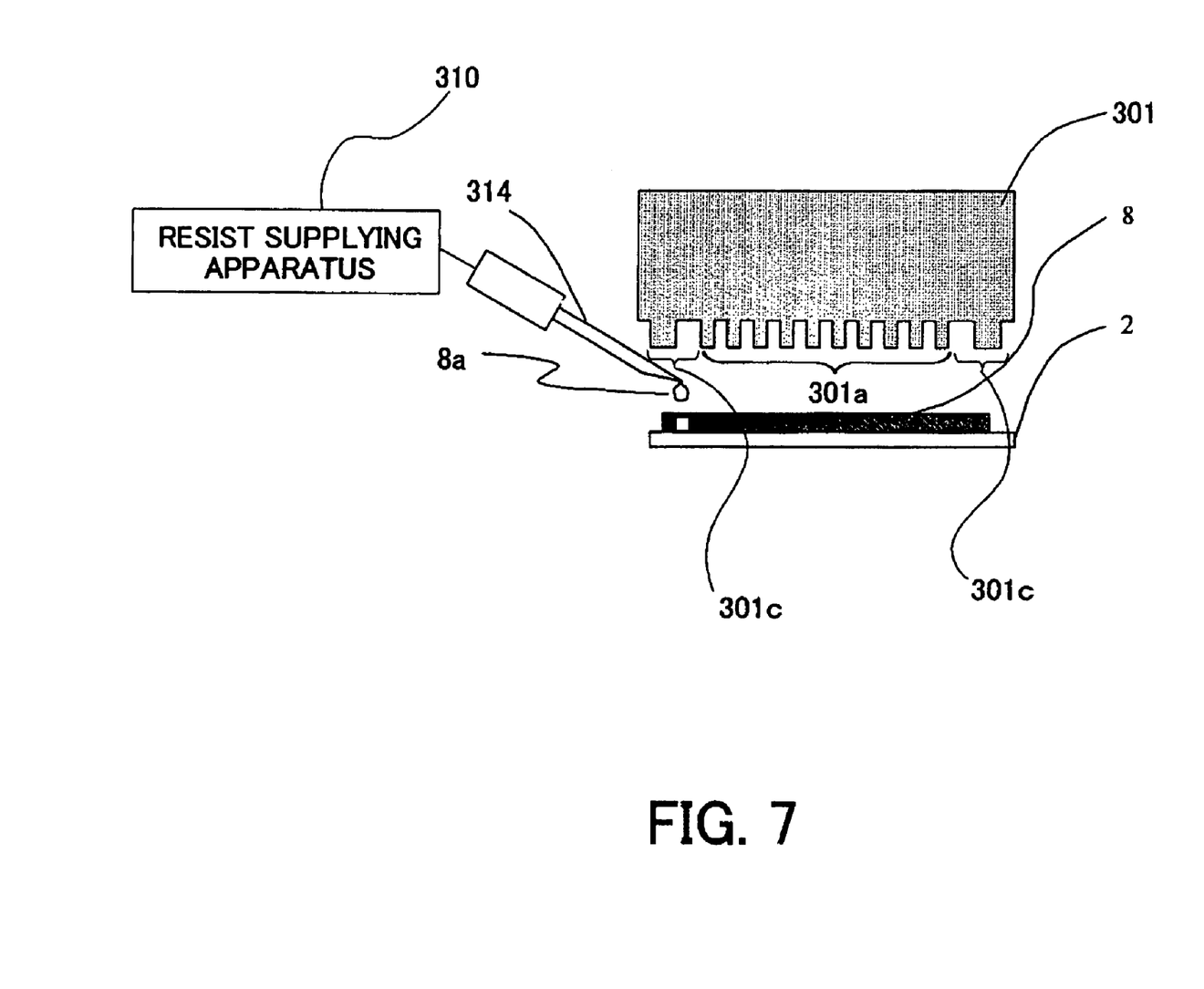
FIG. 7 is a schematic view showing a nanoimprint apparatus that is Embodiment 5 of the present invention.

FIG. 7 shows the configuration of the periphery of the pattern transferring mold used in a nanoimprint apparatus that is Embodiment 5 of the present invention in schematic form. The basic configuration of the nanoimprint apparatus of this embodiment is the same as that of the nanoimprint apparatus of Embodiment 1.

301 denotes a pattern transferring mold of this embodiment. 301*a* denotes a patterned area (first area) where a relief pattern is formed, the patterned area being formed on the bottom face of the mold 301. 301*c* denotes a non-patterned area (second area) which faces the scribe line on the resist 8.

In general, the contacting portion of the mold used in nanoimprint apparatuses is coated with a mold-releasing layer such as teflon to release the mold from the resist without a pattern defect with small force. The mold-releasing force is determined based on free energy which acts in the surface boundary between the mold-releasing layer and the cured resist. Therefore, smaller free energy acting in the surface boundary makes it possible to release the mold with smaller force, further shorten the mold-releasing time, and further reduce pattern damage.

However, a resist favorable to mold release is not always used, depending on conditions of device manufacturing. In other words, there is a case where the mold-releasing force cannot be reduced effectively, depending on the type of resist, even if the contacting portion of the mold is coated with a general mold-releasing layer.

Therefore, the nanoimprint apparatus of this embodiment is equipped with a resist supplying apparatus 310. The resist supplying apparatus 310 supplies a small amount of a resist 8*a* that is different type of resist from the resist 8 for pattern transferring onto an area of the uncured resist 8, the area facing the non-patterned area 301*c* of the mold 301, via a nozzle 314. The resist 8*a* supplied onto the resist 8 functions as a mold-releasing agent for providing a starting point of mold release.

The resist 8*a* as the mold-releasing agent requires a smaller critical surface tension than that of the cured resist 8 for pattern transferring.

Instead of the resist 8a, a bubble of gas such as air or liquid such as water that is not cured by UV irradiation may be mixed into an area of the resist 8, the area facing the non-patterned area 301c.

Embodiment 6

Next, description will be made of the process of manufacturing a semiconductor device using the nanoimprint apparatus of each of Embodiments 1 to 5 described above with reference to a flow chart of FIG. 9.

Figure 9:
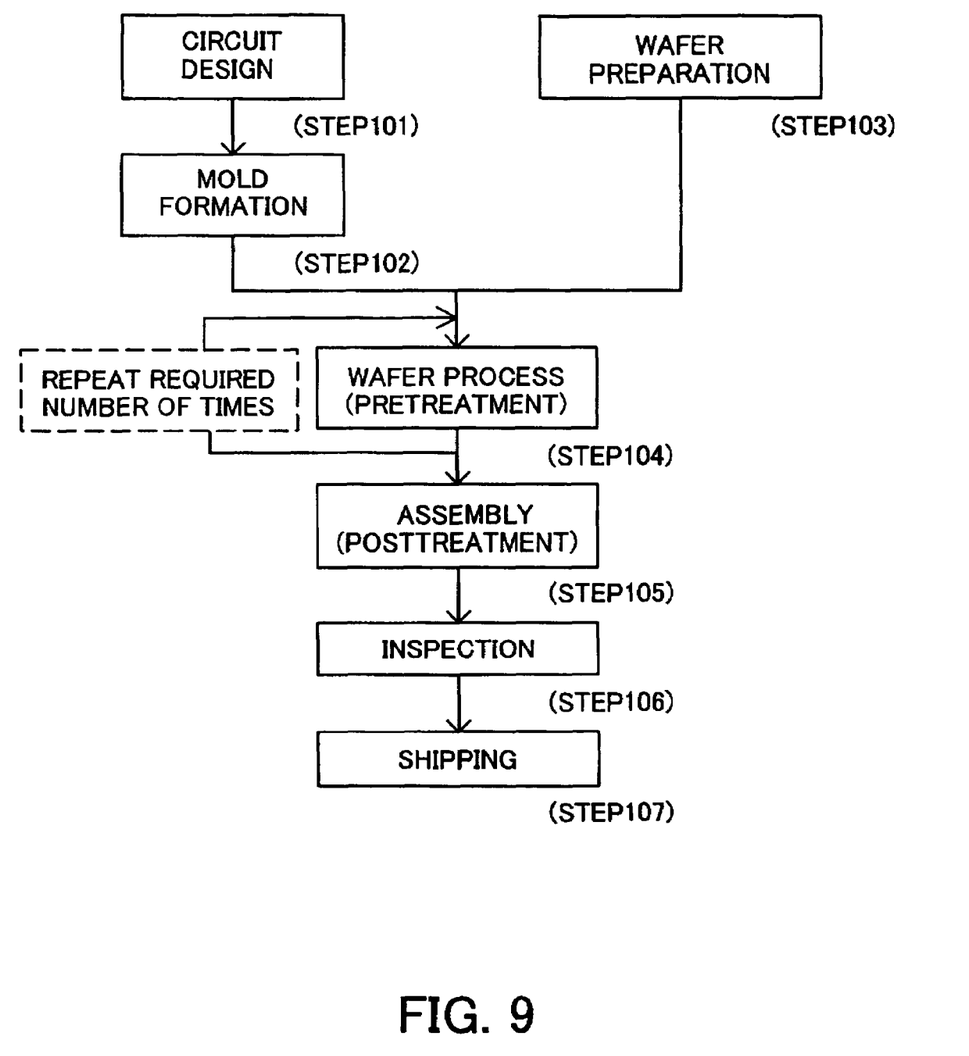
FIG. 9 is a flowchart showing a device manufacturing process using the nanoimprint apparatus, process which is Embodiment 6 of the present invention.

At step 101 (circuit design), the circuit design of the semiconductor device is performed. At step 102 (mold formation), a required number of molds are formed on the basis of the circuit designed at step 101. On the other hand, at step 103 (wafer manufacturing), a wafer is formed by using a material such as silicon.

The next step 104 (wafer process) is called a front-end process in which the abovementioned mold and wafer are used to form a circuit actually on the wafer with the nanoimprint apparatus of each of Embodiments 1 to 5. Step 104 is repeated a necessary number of times as required by replacing molds. In some of the repeated operations, a lithography apparatus such as a reduced projection expose apparatus may be used other than the nanoimprint lithography method.

The next step 105 (assembly) is called as a back-end process in which the wafer processed at step 104 is formed into a semiconductor chip. The back-end process includes an assembly step including an assembly substep (dicing and bonding) and a packaging substep (enclosing of a chip).

At the next step 106 (test), the semiconductor device formed at step 105 is inspected in an operation check test, a durability test and the like. The semiconductor device is finished after these steps, and it is shipped at step 107.

The wafer process at step 104 described above has at least one of the following steps: an oxidation step for oxidizing the surface of the wafer, a CVD step for depositing an insulating film on the wafer surface, an electrode forming step for forming an electrode on the wafer with vapor deposition, an ion implantation step for implanting ion into the wafer, a resist processing step for applying a photo-curing resin to the wafer, a transfer step for transferring a circuit pattern to the wafer after it is subjected to the resist processing step with the abovementioned nanoimprint apparatus, an etching step for removing the photo-curing resin (the resist remainder) other than the transferred pattern from the wafer processed at the transfer step, and a resist removal step for removing the unnecessary photo-curing resin. These steps are repeatedly performed to form a multiplicity of circuit patterns on the wafer.

As described above, according to each of Embodiments 1 to 5, it is possible to reduce the mold-releasing force, shorten the mold-releasing time, and prevent pattern's shape damage since the starting point of mold release is provided on an area on a planar resist, the area being adjacent to an area where the pattern has been transferred. This can improve the throughput of nanoimprint lithography processing repeated quickly in the step and repeat method or the like, and even improve the productivity of semiconductor devices or MEMS.

In addition, providing the starting point of mold release on the scribe line adjacent to the pattern transferred area makes it possible to increase the effective area of the device, thereby enhancing the flexibility in design of the device.

Furthermore, in each of Embodiments 1 to 5, the second area that is not needed originally for pattern transferring is purposely provided, the shape of the second area is formed into a shape for providing the starting area (that is, a starting point or a starting line) of mold release, and a material for providing the starting point is supplied between the second area and the photo-curing resin. These make it possible to provide the starting point of mold release easily and certainly even in a case where pattern transferring is performed onto a planar object surface. Thus, quick and smooth mold release can be achieved while damage to the transferred pattern's shape is avoided.

Moreover, in each of Embodiments 1 to 5, the non-patterned area of the mold is formed so as to correspond to the scribe line area. This makes it possible to prevent the reduction of the number of devices manufactured from one wafer (substrate).

This application claims a foreign priority benefit based on Japanese Patent Application No. 2005-055097, filed on Feb. 28, 2005, which is hereby incorporated by reference herein in its entirety as if fully set forth herein.

What is claimed is:

1. The pattern transferring mold used in a pattern transferring apparatus which brings the mold into contact with a photo-curing resin on a substrate and cures the photo-curing resin by light irradiation to transfer a pattern formed in on the mold onto the photo-curing resin, the pattern transferring mold comprising: a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the mold-releasing shape has a depressed shape whose size is larger than that of the depressed portions in the pattern.

2. The pattern transferring mold according to claim 1, wherein at least part of the second area contacts the photo-curing resin.

3. The pattern transferring mold used in a pattern transferring apparatus which brings the mold into contact with a photo-curing resin on a substrate and cures the photo-curing resin by light irradiation to transfer a pattern formed in on the mold onto the photo-curing resin, the pattern transferring mold comprising: a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the mold-releasing shape has a protruded shape whose height is larger than that of the protruded portions in the pattern.

4. The pattern transferring mold according to claim 3, wherein the protruded shape has a shape whose cross section becomes small towards the substrate.

5. The pattern transferring mold used in a pattern transferring apparatus which brings the mold into contact with a photo-curing resin on a substrate and cures the photo-curing resin by light irradiation to transfer a pattern formed in on the mold onto the photo-curing resin, the pattern transferring mold comprising: a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the second area is an area corresponding to a scribe line that is formed on the photo-curing resin.

6. A pattern transferring apparatus which brings a pattern transferring mold into contact with a photo-curing resin on a substrate and transfers a pattern formed on the mold onto the photo-curing resin by light irradiation to transfer a pattern formed in on the mold onto the photo-curing resin, the pattern transferring apparatus comprising: a pattern transferring mold including a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the mold-releasing shape has a depressed shape whose size is larger than that of the depressed portions in the pattern; and an optical system which irradiates a photo curing resin contacting the pattern transferring mold with light.

7. A pattern transferring apparatus which brings a pattern transferring mold into contact with a photo-curing resin on a substrate and transfers a pattern formed on the mold onto the photo-curing resin by light irradiation to transfer a pattern formed in on the mold onto the photo-curing resin, the pattern transferring apparatus including: a pattern transferring mold including a bottom face which contacts the photo-curing resin, the bottom face portion including a first area in which the pattern is formed and a second area formed outside the first area on the periphery of the mold; and a material supplying unit which supplies material for providing a starting area of mold release from the cured photo-curing resin between the second area and the uncured photo-curing resin; wherein the second area is an area corresponding to a scribe line that is formed on the photo-curing resin.

8. A device manufacturing method comprising: preparing a pattern transferring apparatus which brings a pattern transferring mold into contact with a photo-curing resin on a substrate and transfers a pattern formed on the mold onto the photo-curing resin by light irradiation, the pattern transferring apparatus including: a pattern transferring mold and an optical system which irradiates a photo-curing resin contacting the pattern transferring mold with light, wherein the pattern-transferring mold includes a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the mold-releasing shape has a depressed shape whose size is larger than that of the depressed portions in the pattern; and transferring the pattern onto the photo-curing resin using the pattern transferring apparatus.

9. A device manufacturing method comprising: preparing a pattern transferring apparatus which brings a pattern transferring mold into contact with a photo-curing resin on a substrate and transfers a pattern formed on the mold onto the photo-curing resin by light irradiation, the pattern transferring apparatus including: a pattern transferring mold and an optical system which irradiates a photo-curing resin contacting the pattern transferring mold with light, wherein the pattern-transferring mold includes a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the mold-releasing shape has a protruded shape whose height is larger than that of the protruded portions in the pattern; and transferring the pattern onto the photo-curing resin using the pattern transferring apparatus.

10. A device manufacturing method comprising: preparing a pattern transferring apparatus which brings a pattern transferring mold into contact with a photo-curing resin on a substrate and transfers a pattern formed on the mold onto the photo-curing resin by light irradiation, the pattern transferring apparatus including: a pattern transferring mold and an optical system which irradiates a photo-curing resin contacting the pattern transferring mold with light, wherein the pattern-transferring mold includes a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the second area is an area corresponding to a scribe line that is formed on the photo-curing resin; and transferring the pattern onto the photo-curing resin using the pattern transferring apparatus.

11. The pattern transferring mold according to claim 3, wherein at least part of the second area contacts the photo-curing resin.

12. The pattern transferring mold according to claim 5, wherein at least part of the second area contacts the photo-curing resin.

13. A pattern transferring apparatus which brings a pattern transferring mold into contact with a photo-curing resin on a substrate and transfers a pattern formed on the mold onto the photo-curing resin by light irradiation to transfer a pattern formed in on the mold onto the photo-curing resin, the pattern transferring apparatus comprising: a pattern transferring mold including a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the mold-releasing shape has a protruded shape whose height is larger than that of the protruded portions in the pattern; and an optical system which irradiates a photo curing resin contacting the pattern transferring mold with light.

14. A pattern transferring apparatus which brings a pattern transferring mold into contact with a photo-curing resin on a substrate and transfers a pattern formed on the mold onto the photo-curing resin by light irradiation to transfer a pattern formed in on the mold onto the photo-curing resin, the pattern transferring apparatus comprising: a pattern transferring mold including a bottom face which contacts the photo-curing resin, the bottom face portion including a first area in which the pattern is formed and a second area formed outside the first area on the periphery of the mold, wherein the pattern-transferring mold has a mold releasing shape in the second area, the mold releasing shape providing a starting area of mold release from the cured photo-curing resin, and wherein the second area is an area corresponding to a scribe line that is formed on the photo-curing resin; and an optical system which irradiates a photo-curing resin contacting the pattern transferring mold with light.

15. The pattern transferring apparatus according to claim 13, wherein the protruded shape has a shape whose cross section becomes small towards the substrate.

* * * * *